(12) United States Patent
Nozawa

(10) Patent No.: US 7,414,361 B2
(45) Date of Patent: Aug. 19, 2008

(54) LIGHT-EMITTING DEVICE AND ELECTRONIC APPARATUS HAVING A ROUGHING FACE FORMED ON PARTITION WALL

(75) Inventor: Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 325 days.

(21) Appl. No.: 11/050,808

(22) Filed: Feb. 7, 2005

(65) Prior Publication Data

US 2005/0200273 A1 Sep. 15, 2005

(30) Foreign Application Priority Data

Mar. 3, 2004 (JP) ............................. 2004-059304
Nov. 26, 2004 (JP) ............................. 2004-341587

(51) Int. Cl.
*H01J 1/62* (2006.01)
*H01J 63/04* (2006.01)

(52) U.S. Cl. ...................... 313/506; 313/509; 313/512; 445/23

(58) Field of Classification Search ................ 313/506, 313/509, 512
See application file for complete search history.

(56) References Cited

U.S. PATENT DOCUMENTS 6,810,919 B2  11/2004  Seki et al.
7,109,653 B2   9/2006  Imamura
2002/0017862 A1*  2/2002  Sasaki et al. ................. 313/582
2003/0054186 A1   3/2003  Miyashita et al.
2004/0160178 A1*  8/2004  Qiu et al. ...................... 313/512

FOREIGN PATENT DOCUMENTS

| JP | A-11-329741 | 11/1999 |
|---|---|---|
| JP | A 2000-353594 | 12/2000 |
| JP | A-2002-062420 | 2/2002 |
| JP | A-2003-123988 | 4/2003 |
| JP | A-2003-186420 | 7/2003 |
| JP | A-2003-229260 | 8/2003 |
| JP | A-2003-243158 | 8/2003 |
| KR | A-2003-0086296 | 11/2003 |
| WO | WO 99/48339 | 9/1999 |
| WO | WO 03/061346 A1 | 7/2003 |

* cited by examiner

*Primary Examiner*—Toan Ton
*Assistant Examiner*—Bumsuk Won
(74) *Attorney, Agent, or Firm*—Oliff & Berridge, PLC

(57) ABSTRACT

To provide a light-emitting device in which a partition wall portion and a second electrode are not peeled off and display failure hardly occurs, a method of manufacturing the light-emitting device, and an electronic apparatus comprising the light-emitting device. An area in which a lyophobic portion is not formed is formed on a partition wall other than peripheries of pixel electrodes. In addition, a negative electrode is formed to directly come in contact with the area of the partition wall in which the lyophobic portion is not formed.

12 Claims, 11 Drawing Sheets

LIGHT-EMITTING DEVICE AND ELECTRONIC APPARATUS HAVING A ROUGHING FACE FORMED ON PARTITION WALL

BACKGROUND

The present invention relates to a light-emitting device, a method of manufacturing the light-emitting device, and an electronic apparatus.

DESCRIPTION OF THE RELATED ART

Recently, from the view point of decrease in size and thickness, light-emitting devices have been noted which have a first electrode, a second electrode, and a light-emitting layer between the first electrode and the second electrode.

As such light-emitting devices, there have been developed organic electroluminescence devices of which the light-emitting layer is made of an organic material. Light-emitting devices used as the organic electroluminescence device could be also referred to as organic EL devices, organic light-emitting diode devices, light-emitting polymer devices, and OLED devices. The organic electroluminescence devices could be manufactured using a liquid phase method (for example, an inkjet method, a slit coating method, a dispensing method, a screen print method, etc.). That is, a plurality of first electrodes formed to correspond to respective pixel forming areas and partition walls partitioning the first electrodes are provided, a liquid droplet material in which an organic material is dissolved in a predetermined solvent or dispersed in a predetermined dispersion medium is arranged on the first electrodes formed in the pixel forming areas, and then the solvent or the dispersion medium is removed, thereby forming an organic compound layer including a light-emitting layer. Thereafter, the second electrode is formed to cover the organic compound layer and the partition walls.

In such a liquid phase method, each partition wall comprises a first partition wall portion directly coming in contact with the pixel electrode and a second partition wall portion formed on the first partition wall portion. Then, by performing a lyophilic process to the first partition wall portion and the first electrode and performing a lyophobic process to the second partition wall portion, the arranged liquid droplets are brought into close contact with the pixel electrode and mixture with the liquid droplets arranged in the adjacent first electrode (pixel electrode) is prevented (for example, see Patent Document 1).

SUMMARY

However, in the light-emitting devices having the above-mentioned structure, since the surface of the second partition wall is subjected to, for example, the lyophobic process to include fluorine elements, surface energy level thereof is low and the second electrode does not come in close contact with the partition walls, so that the second electrode is peeled off. Even when the second electrode comes in close contact with the partition wall, the second electrode is subjected to stress due to execution of the light emitting operation or change in environment such as temperature, so that the second electrode can be peeled off from the partition wall. As a result, a problem that light emission failure occurs comes up.

The present invention is contrived to solve the above-mentioned problems, and it is an object of the present invention to provide a light-emitting device in which the partition wall and the second electrode are not peeled off from each other, which is resistant to deterioration with time or environment and which has high reliability, a method of manufacturing the light-emitting device, and an electronic apparatus comprising the light-emitting device.

MEANS FOR SOLVING THE PROBLEMS

According to an aspect of the present invention, there is provided a light-emitting device, wherein a plurality of pixel forming areas are partitioned on a substrate by a partition wall, wherein a first electrode, a second electrode formed to cover the partition wall and the pixel forming area, and an organic compound layer having at least a light-emitting layer between the first electrode and the second electrode are formed in each pixel forming area, wherein the partition wall has a top wall portion and a side wall portion, and wherein a adhesion portion bringing the second electrode into close contact with the partition wall is provided on at least a part of the top wall portion of the partition wall. It is preferable that the adhesion portion is formed in the area on the partition wall portion other than the peripheries of the first electrode and that the contact portion is made of an organic material. The partition wall has a first partition wall portion and a second partition wall portion formed on the first partition wall. The first partition wall portion is made of an inorganic material and the second partition wall portion is made of an organic material. The adhesion portion is formed out of a part of the second partition wall portion.

According to the construction described above, the adhesion portion is formed on a part of the top wall portion of the partition wall. Therefore, in the light-emitting device in which the second electrode is formed to cover the organic compound layer and the partition wall, it is possible to prevent the second electrode and the partition wall from being peeled off from each other, by forming the adhesion portion. Therefore, since the partition wall and the second electrode are strongly bonded to each other, it is possible to embody a light-emitting device having high reliability even when the light emitting operation is performed or even when environments such as temperature change. It is preferable that the adhesion portion is made of an organic material, that is, the same material as the partition wall. As a result, it is possible to improve adherence between the partition wall and the second electrode.

In the light-emitting device, a lyophobic portion may be formed on the partition wall and the adhesion portion may be a portion formed by removing a part of the lyophobic portion. The partition wall may comprise a first partition wall portion and a second partition wall portion formed on the first partition wall portion, the lyophobic portion may be formed on the surface of the second partition wall portion, and the adhesion portion may be a portion formed by removing a part of the lyophobic portion.

For example, when the lyophobic portion is formed on the whole surface of the partition wall to include fluorine atoms, the surface energy is low and the bonding power between the lyophobic portion of the partition wall and the second electrode is small. However, since a part of the lyophobic portion is removed, the bonding power between the partition wall and the second electrode can be enhanced. Accordingly, it is possible to prevent the partition wall and the second electrode from being peeled off at the interface therebetween.

In the light-emitting device, a driving circuit may be provided correspondingly to the respective pixel forming areas, a stepped portion may be formed on the surface of the partition wall due to the driving circuit, and the adhesion portion may be formed on the stepped portion. The driving circuit according to the present invention can include a variety of functional elements such as transistor, diode, capacitor, etc., a variety of wires such as scanning line, data line, power source line, etc., and contact holes for electrically connecting the wires to the function elements. The driving circuit may include at least two metal layers and may have an area where a plurality of metal layers are two-dimensionally superposed, and the adhesion portion may be provided on the stepped portion due to the aforementioned area. For example, the adhesion portion may be provided correspondingly to a storage capacitor and an intersection between a scanning line and a data line or an intersection between a scanning line and a power source line.

According to this structure, the adhesion portion can be formed using the stepped portion formed on the top wall portion of the partition wall.

In the light-emitting device, the adhesion portion may be a portion formed by roughening the partition wall.

According to this structure, since the surface area in which the partition wall and the second electrode are in contact with each other can be enhanced by the roughening, the bonding power between the partition wall and the second electrode can be improved, thereby preventing the second electrode from being peeled off from the partition wall. When at least the surface of the partition wall is made of an organic material, it is possible to easily form the roughened portion on the partition wall using a surface process such as an oxygen plasma process.

In the light-emitting device, the adhesion portion may be a portion formed by oxidizing or nitrifying the partition wall.

According to this structure, when the adhesion portion is formed by oxidizing or nitrifying at least a part of the partition wall, the surface energy of the adhesion portion can be increased, thereby improving the affinity between the partition wall and the second electrode. As a result, it is possible to prevent the second electrode from being peeled off. When the partition wall is made of acryl resin or polyimide resin, it is possible to easily form the adhesion portion by oxidization or nitrification, because acryl resin or polyimide resin includes oxygen atoms or nitrogen atoms.

The light-emitting device may further comprise a sealing layer having a first sealing layer and a second sealing layer and covering the second electrode. The first sealing layer may be made of organic resin, and the second sealing layer may be made of silicon oxide or silicon oxynitride.

According to this structure, since the partition wall including the adhesion portion and the first sealing layer are all made of organic resin, the stress between the second electrode and the partition wall can be reduced. As a result, it is possible to satisfactorily prevent moisture or oxygen from diffusing into light-emitting elements. Specifically, it is preferable that the partition wall and the first sealing layer are made of materials having the same film stress. It is also preferable that the first partition wall portion and the second sealing layer are all made of silicon oxide as a major component.

According to another aspect of the present invention, there is provided a method of manufacturing a light-emitting device, the method comprising the steps of: forming a first electrode; forming a partition wall having an top wall portion and a side wall portion to overlap at least a part of the first electrode; forming a adhesion portion on at least a part of the top wall portion of the partition wall; arranging a liquid material including an organic compound in pixel forming areas partitioned by the partition wall; and forming a second electrode on the adhesion portion to cover the partition wall and the pixel forming areas.

According to this structure, in the light-emitting device in which the second electrode is formed to cover the organic compound layer and the partition wall, it is possible to prevent the second electrode and the partition wall from being peeled off, by forming the adhesion portion. Therefore, since the partition wall and the second electrode are strongly bonded to each other, it is possible to embody a light-emitting device having high reliability even when the light emitting operation is performed or even when environments such as temperature change.

In the method of manufacturing a light-emitting device, the step of forming the partition wall may be a step of forming at least a part of the top wall portion of the partition wall out of an organic material, and the step of forming the adhesion portion may be a step of forming the adhesion portion out of the organic material constituting the partition wall. The step of forming the partition wall may comprise a step of forming a first partition wall portion using an inorganic material to overlap at least a part of the first electrode and a step of forming a second partition wall portion on the first partition wall portion using an organic material, and the step of forming the adhesion portion may be a step of forming the adhesion portion out of the organic material constituting the second partition wall portion.

According to this structure, since the partition wall and the adhesion portion are made of the same organic material, it is possible to enhance the bonding power between the partition wall and the second electrode without causing stress.

In the method of manufacturing a light-emitting device, the step of forming the partition wall may include a step of forming a lyophobic portion on the partition wall, and the step of forming the adhesion portion may be a step of removing a part of the lyophobic portion.

For example, when the lyophobic portion is formed on the whole surface of the partition wall to include fluorine atoms, the surface energy is low and the bonding power between the lyophobic portion of the partition wall and the second electrode is thus small. However, since a part of the lyophobic portion is removed, the surface energy can be increased thereby enhancing the bonding power between the partition wall and the second electrode. Accordingly, it is possible to prevent the partition wall and the second electrode from being peeled off at the interface therebetween.

The method of manufacturing a light-emitting device may further comprise a step of forming a driving circuit and forming a first stepped portion. The step of forming the partition wall may be a step of forming a second stepped portion corresponding to the first stepped portion on the top wall portion of the partition wall, and the step of forming the adhesion portion may be a step of cutting out a part of the partition wall correspondingly to the second stepped portion.

According to this structure, the adhesion portion can be formed using the second stepped portion formed on the top wall portion of the partition wall. The driving circuit according to the present invention can include a variety of functional elements such as transistor, diode, capacitor, etc., a variety of wires such as scanning line, data line, power source line, etc., and contact holes for electrically connecting the wires to the function elements. The driving circuit may include at least two metal layers and may have an area where a plurality of metal layers are two-dimensionally superposed, and the adhesion portion may be formed on the second stepped portion formed in the area where the plurality of metal layers is two-dimensionally superposed. For example, the adhesion portion may be provided correspondingly to a storage capacitor and an intersection between a scanning line and a data line or an intersection between a scanning line and a power source line.

In the method of manufacturing a light-emitting device, the step of forming the adhesion portion may be a step of roughening the top wall portion of the partition wall.

According to this structure, since the surface area in which the partition wall and the second electrode are in contact with each other can be enhanced by the roughening, the bonding power between the partition wall and the second electrode can be improved. Therefore, the peeling-off of the second electrode can be prevented. When at least the surface of the partition wall is made of an organic material, it is possible to easily form the roughened portion on the partition wall using a surface process such as an oxygen plasma process.

In the method of manufacturing a light-emitting device, the step of forming the adhesion portion may be a step of oxidizing or nitrifying the top wall portion of the partition wall.

According to this structure, when the adhesion portion is formed by oxidizing or nitrifying at least a part of the partition wall, the surface energy of the adhesion portion can be increased, thereby improving the affinity between the partition wall and the second electrode. As a result, it is possible to prevent the second electrode from being peeled off. When the partition wall is made of acryl resin or polyimide resin, it is possible to easily form the adhesion portion by oxidization or nitrification, because acryl resin or polyimide resin includes oxygen atoms or nitrogen atoms.

In the method of manufacturing a light-emitting device, the step of forming the adhesion portion may include the steps of: covering a portion of the partition wall corresponding to the peripheral border of the first electrode with a mask; and forming the adhesion portion using the mask.

According to this structure, by providing an area other than the peripheral border portion of the first electrode portion with the adhesion portion to be strongly bonded to the second electrode, it is possible to manufacture a light-emitting device in which the second electrode is hardly peeled off. By forming the adhesion portion in a state where the area of the second partition wall portion (slope area of the second partition wall portion) corresponding to the peripheral border portion of the first electrode is protected by the mask, the liquid material can be arranged in a desired area (the pixel forming area on the first electrode) without allowing the liquid material to the area corresponding to the peripheral border portion of the first electrode, thereby effectively using the liquid material.

The method of manufacturing a light-emitting device may further comprise a step of cleaning or activating the first electrode, and the step of forming the adhesion portion may be performed at the same time as the step of cleaning or activating the first electrode. The step of forming the adhesion portion may include a step of covering the area of the partition wall corresponding to the peripheral border portion of the first electrode with a mask and forming openings in the areas of the mask corresponding to at least a part of the top wall portion of the partition wall and the areas partitioned by the partition wall, and a step of forming the adhesion portion using the mask having the openings.

According to this structure, by simultaneously performing the step of forming the adhesion portion, the step of cleaning or activating the first electrode, and the step of protecting the area corresponding to the peripheral border portion of the first electrode, it is possible to form the adhesion portion without increasing the number of steps for manufacturing a light-emitting device.

In the method of manufacturing a light-emitting device, the step of forming the first electrode may be a step of forming the first electrode out of metal oxide and the step of cleaning or activating the first electrode and forming the adhesion portion may be a step of oxidation. By forming the first electrode out of metal oxide such as indium tin oxide, amorphous indium oxide or zinc oxide, etc. and oxidizing at least the first electrode and a part of the top wall portion of the partition wall, the first electrode can be cleaned or activated at the same time as formation the adhesion portion.

In the method of manufacturing a light-emitting device, the step of arranging the liquid material containing organic compounds in the areas partitioned by the partition wall may be a step of arranging droplets of the liquid material containing organic compounds using an inkjet method, and the step of forming the adhesion portion may be a step of forming the adhesion portion in the areas satisfying the following condition (Expression 1).

$$R_4 \geq R_3 \geq (R_1 + R_2)$$ (Expression 1)

Here, $R_1$ denotes a radius of a liquid droplet, $R_2$ denotes variation in arrangement when the droplet is discharged from the inkjet head, $R_3$ denotes a distance between the partition wall and the adhesion portion, and $R_4$ denotes a gap between a pixel forming area and the next pixel forming area.

In this way, since the portion in which the liquid droplets are arranged can become the lyophobic portion or the pixel forming area, the liquid droplets can be arranged in a predetermined pixel forming area without flowing in other adjacent pixel forming area over the partition wall.

An electronic apparatus according to the present invention comprises the light-emitting device described above.

According to this structure, it is possible to provide an electronic apparatus comprising the light-emitting device in which the second electrode is not peeled off and the display failure hardly occurs.

DETAILED DESCRIPTION OF EMBODIMENTS

Description of the Embodiments

Hereinafter, embodiments in which a light-emitting device according to the present invention is applied to an organic electroluminescence device will be described with reference to the drawings.

First Embodiment (Light-Emitting Device)

Figure 1:
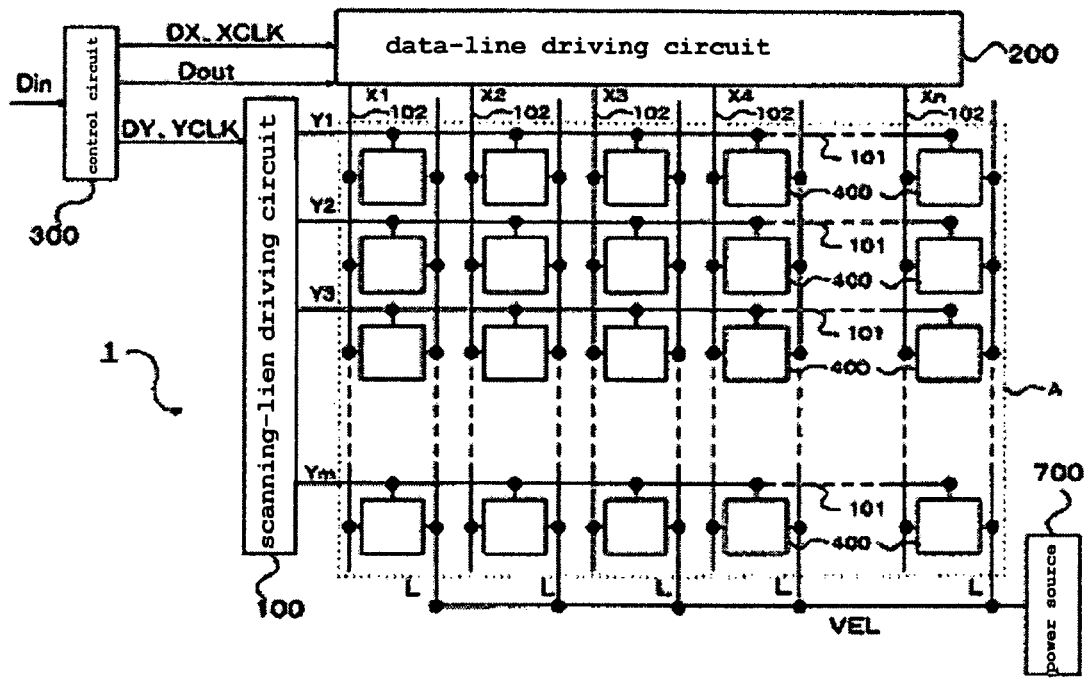
FIG. 1 is a block diagram schematically illustrating a structure of a light-emitting device.

FIG. 1 is a block diagram schematically illustrating a structure of a light-emitting device 1 according to the present invention. The light-emitting device 1 comprises a pixel area A, a scanning-line driving circuit 100, a data-line driving circuit 200, a control circuit 300, and a power source circuit 700. In the pixel area A, m scanning lines 101 are formed parallel to the X direction. n data lines 103 are formed parallel to the Y direction perpendicular to the X direction. Pixel circuits 400 are provided to correspond to intersections between the scanning lines 101 and the data lines 103. Each pixel circuit 400 includes a light-emitting element OLED. Each pixel circuit 400 is supplied with source potential VEL generated from the power source circuit 700 through a plurality of power source lines L. In this example, the power source lines L are provided to be parallel to the data lines 103, and the source potential VEL is supplied from one end thereof.

The scanning-line driving circuit 100 generates scan signals Y1, Y2, Y3, . . . , Ym for sequentially selecting the plurality of scanning lines 101. The scan signals Y1, Y2, Y3, . . . , Ym are generated by sequentially transmitting a Y transmission start pulse DY in synchronism with a Y clock signal YCLK. The scan signal Y1 is a pulse having a width corresponding to a horizontal scan period 1H from the first timing of a vertical scan period 1F and is supplied to the first scanning line 101. Thereafter, this pulse is sequentially shifted and is supplied to each of the second, third, . . . , m-th scanning lines 101 as a scan signal Y2, Y3, . . . , Ym. In general, when the scan signal Y1 supplied to the i-th scanning line 101 (i is an integer satisfying $1 \leq i \leq m$) becomes an "H" level, it indicates that the scanning line 101 is selected.

The data-line driving circuit 200 supplies gray-scale signals X1, X2, X3, X4, . . . , Xn to the respective pixel circuits 400 positioned at the selected scanning line 101 on the basis of output gray-scale data Dout. In this example, the gray-scale signals X1 to Xn are applied as current signals indicating gray-scale brightness levels.

The control circuit 300 generates various control signals such as a Y clock signal YCLK, an X clock signal XCLK, an X transmission start pulse DX, and a Y transmission start pulse DY, and outputs the generated control signals to the scanning-line driving circuit 100 and the data-line driving circuit 200. In addition, the control circuit 300 performs an image process such as gamma correction to input gray-scale data Din externally supplied to generate output gray-scale data Dout.

Figure 2:
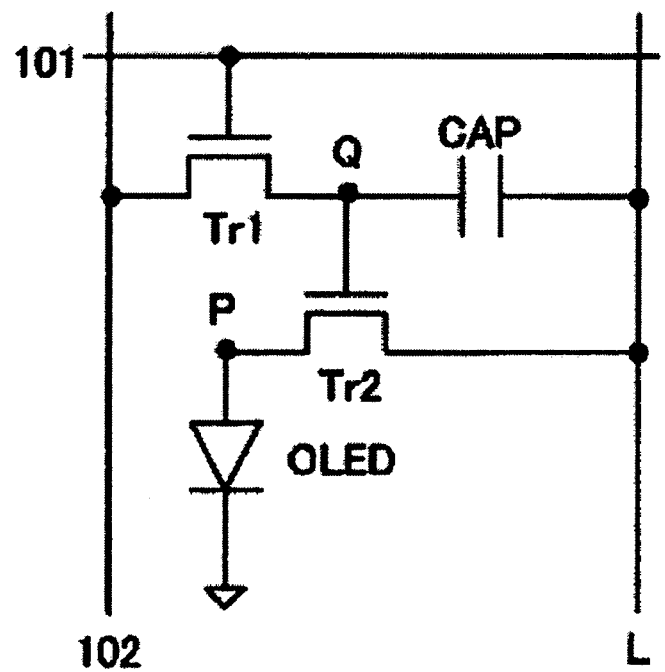
FIG. 2 is a circuit diagram of a pixel circuit.

FIG. 2 shows a circuit diagram of one pixel circuit 400. The pixel circuit 400 comprises a hold transistor Tr1, a driving transistor Tr2, a storage capacitor CAP, and a light-emitting element OLED. The gate of the hold transistor Tr1 is supplied with the scan signal (Y1, Y2, Y3, . . . , Ym) through the scanning line 101, and the source thereof is connected to one of the data lines 102 and is supplied with one of the gray-scale signals X1, X2, X3, X4, . . . , Xn. The drain of the hold transistor Tr1, the gate of the driving transistor Tr2, and one end of the storage capacitor CAP are mutually connected. The other end of the storage capacitor CAP is connected to the power source line L, but may be connected to a line having a fixed potential. The gray-scale signal is written to the storage capacitor CAP in the selection period, the written voltage is held till the next selection period, and the light-emitting element OLED emits light in accordance with the gray-scale signal.

Figure 3:
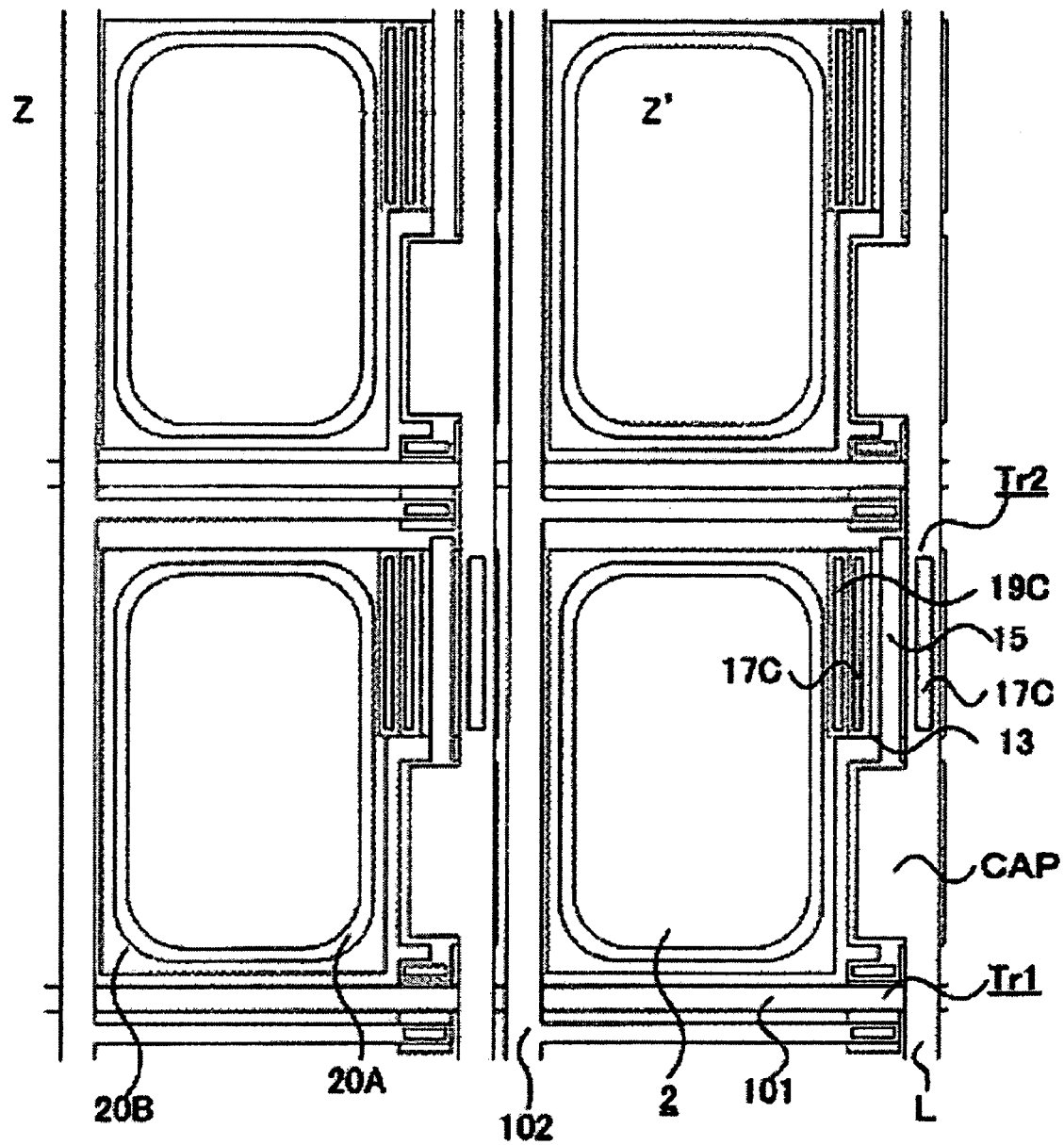
FIG. 3 is a plan view of the pixel circuit.
Figure 4:
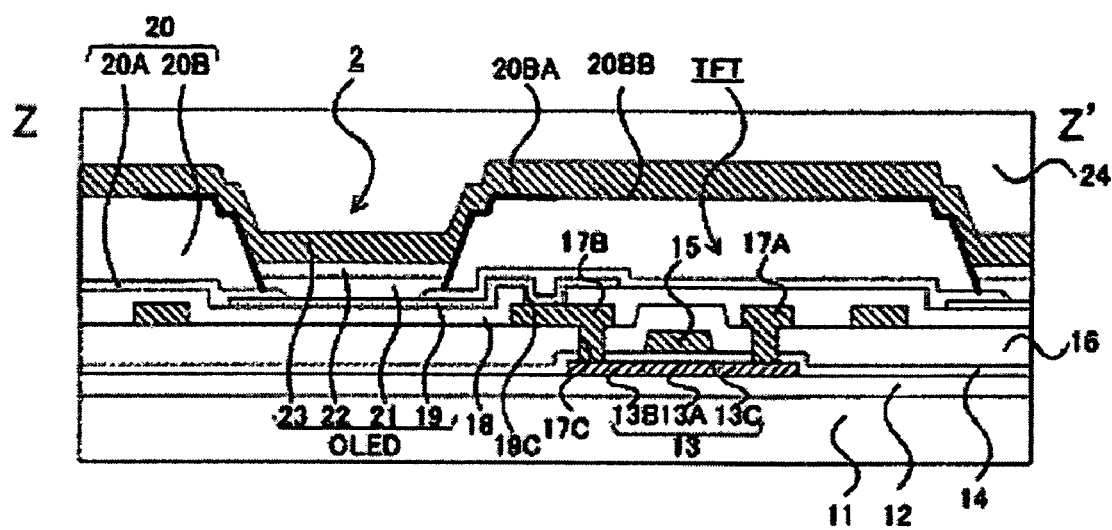
FIG. 4 is a cross-sectional view taken along Line Z-Z' shown in FIG. 3.

FIG. 3 is a plan view illustrating the pixel circuit 400 and FIG. 4 is a cross-sectional view taken along Line Z-Z' shown in FIG. 3. A driving transistor Tr2 is provided on a substrate 11 with a base protecting layer 12 mainly made of silicon oxide therebetween. A silicon layer 13 is formed on the base protecting layer 12. A gate insulating layer 14 is formed on the base protecting layer 12 to cover the silicon layer 13. A portion on the gate insulating layer 14 opposing the silicon layer is provided with a gate electrode 15. V-family elements are doped in the silicon layer 13 through the gate electrode 15, thereby forming a drain region 13B and a source region 13C. Here, the region not doped with the V-family elements serves as a channel region 13A. A first interlayer insulating layer 16 is formed on the gate insulating layer 14 to cover the gate electrode 15. A drain electrode 17 is connected to the drain region 13B through a contact hole 17C which is opened through the gate insulating layer 14 and the first interlayer insulating layer 16. On the other hand, a source electrode 17B is provided at a position opposing the drain electrode 17A with the gate electrode 15 therebetween, and is connected to the source region 13C through a contact hole 17C which is opened through the gate insulating layer 14 and the first interlayer insulating layer 16. A second interlayer insulating layer 18 is formed on the first interlayer insulating layer 16 to cover the drain electrode 17A and the source electrode 17B. A pixel electrode (first electrode) 19 serving as a positive electrode of the light-emitting device is connected to the source electrode 17B through a contact hole 19C which is opened through the second interlayer insulating layer 18. The pixel electrode 19 is made of metallic oxide such as indium tin oxide (ITO), amorphous indium oxide or zinc oxide, etc. The pixel electrode 19 is supplied with carriers corresponding to current density of driving current supplied from the driving transistor Tr2.

The partition wall 20 partitions the respective pixel electrodes 19 to form a pixel forming area 2, and is formed to cover the contact hole 17C, the contact hole 19C, the hold transistor Tr1, the driving transistor Tr2, the storage capacitor CAP, the scanning line 101, the data line 102, and the power source line L.

The partition wall 20 comprises a first partition wall portion 20A formed adjacent to the pixel electrode 19 and a second partition wall portion 20B formed on the first partition wall portion 20A. The first partition wall portion 20A is made of an inorganic material such as silicon oxide, silicon oxynitride, etc. The second partition wall portion 20B is made of an organic material such as polyimide resin, acryl resin, etc. The second partition wall portion 20B has a top wall portion and a side wall portion, and the side wall portion has a slope. That is, the area of an opening of the second partition wall portion 20B is small at the first partition wall side 20A, and the area of the opening of the second partition wall portion 20B becomes greater toward the top wall portion from the first partition wall portion 20A.

The partition wall 20 has a structure that the first partition wall portion 20A two-dimensionally is protruded and exposed toward the center of the pixel forming area 2 from the second partition wall portion 20B. Therefore, in the pixel forming area 2, the second partition wall portion 20B is formed such that the flat portion of the first partition wall portion 20A is formed at the boundary between the first partition wall portion 20A and the second partition wall portion 20B. As a result, in each pixel forming area 2, the lyophilic property is predominant in the vicinity of the portion where the partition wall 20 and the pixel electrode 19 come in contact with each other, and the lyophobic property is predominant at the top portion of the partition wall 20.

The lyophobic portion 20BA is formed on the surface of the second partition wall portion 20B including at least the side wall portion. The lyophobic portion includes, for example, fluorine atoms, thereby reducing the surface energy. The lyophobic portion has a lyophobic property greater than that of the pixel electrode 19 and the first partition wall portion 20A.

At least a adhesion portion 20BB is formed on the surface of the second partition wall portion 20B corresponding to the area where any one of the contact hole 17C, the contact hole 19C, the hold transistor Tr1, the driving transistor Tr2, the storage capacitor CAP, the scanning line 101, the data line 102, and the power source line L is formed. The lyophobic portion 20BA is not formed in the adhesion portion 20BB. The adhesion portion 20BB includes, for example, oxygen atoms or nitrogen atoms, so that the surface energy is increased. Therefore, it is preferable that the adhesion portion 20BB includes polyimide resin and acryl resin.

The light-emitting element OLED is formed in the pixel forming area 2 partitioned by the partition wall 20. As shown in FIG. 4, each hole transporting layer 21 is fixed to the corresponding pixel electrode 19. The light-emitting layer 22 is formed in the predetermined pixel forming area 2 without mixing with another light-emitting layer 22 formed in an adjacent pixel forming area 2.

The hole transporting layer 21 is made of an organic material such as polythiophene derivatives, polypyrrole derivatives, etc. or a material doped therewith. The hole transporting layer 21 serves as a layer for efficiently injecting carriers supplied from the corresponding pixel electrode 19 into the light-emitting layer 22.

The light-emitting layer 22 is made of an organic material. Specifically, the light-emitting layer 22 is made of a known light-emitting organic material capable of emitting fluorescence or phosphorescence. More specifically, (poly) fluorene derivatives (PF), (poly) paraphenylene vinylene derivatives (PPV), polyphenylene derivatives (PP), polyparaphenylene derivatives (PPP), polyvinylcarbazole (PVK), polythiophene derivatives, polydialkylfluorene (PDAF), polyfluorenebenzothiadiazole (PFBT), polyalkylthiophene (PAT), and polysilane group such as polymethylphenylsilane (PMPS) can be suitably used.

These high polymer materials may be doped with lower polymer materials such as perylene dye, coumarin dye, rhodamine dye, etc., or lower polymer materials such as rubrene, perylene, 9,10-diphenylanthracene, tetraphenylbutadiene, Nile red, coumarin 6, quinacridone, etc.

The negative electrode 23 may be a metal layer having one layer, and may a metal layer having two or three layers. Specifically, the negative electrode 23 is made of single metal such as aluminum (Al), magnesium (Mg), lithium (Li), calcium (Ca), etc. or magnesium (Mg)—aluminum (Al) alloy (Mg:Al=10:1). A stacked film such as Lithium oxide ($Li_2O$)/ Aluminum (Al), lithium fluoride (LiF)/aluminum (Al), magnesium fluoride ($MgF_2$)/aluminum (Al), etc. is suitably used.

The light-emitting element OLED includes the pixel electrode 19, the hole transporting layer 21, the light-emitting layer 22, and the negative electrode 23. The light-emitting element may include a hole transporting layer, a hole blocking layer, an electron transporting layer, an electron injecting layer, and an electron blocking layer.

A sealing layer 24 is formed to cover the whole surface of the negative electrode 23 of the light-emitting element OLED. It is preferable that the sealing layer 24 has a first sealing layer made of organic resin, and a second sealing layer made of inorganic material such as silicon oxide or silicon oxynitride and formed to have a gas barrier property and to cover the first sealing layer.

The adhesion portion 20BB formed on the second partition wall portion 20B comes in direct contact with the negative electrode 23. Since the lyophobic portion 20BA has high surface energy, the bonding power between the negative electrode 23 and the lyophobic portion 20BA is small, but the adhesion portion 20BB and the negative electrode 23 are strongly bonded to each other. That is, since the second partition wall portion 20B in which the lyophobic portion 20BA is not formed serves as a adhesion portion bonding the partition wall 20 and the negative electrode 14 to each other, it is possible to embody a light-emitting device in which the partition wall 20 and the second electrode 23 are not peeled off from each other, thereby providing great resistance to deterioration or change in environment and high reliability.

It is preferable that the adhesion portion 20BB is formed by roughening the top wall portion of the second partition wall portion 20B. By roughening the top wall portion, the surface area where the second partition wall portion 20B and the negative electrode 23 are in contact with each other can be increased, so that it is possible to improve the adherence between the partition wall 20 and the negative electrode 23.

In the embodiment described above, the lyophobic portion 20BA is formed and the adhesion portion 20BB is formed by removing a part of the lyophobic portion 20BA. However, the adhesion portion may be formed by roughening at least a part of the top wall portion of the second partition wall portion 20B and then the lyophobic portion 20BA may be formed on the whole surface of the second partition wall portion 20B. By roughening the top wall portion, the surface area where the second partition wall portion 20B and the negative electrode 23 are in contact with each other can be increased, so that it is possible to improve the adherence between the partition wall 20 and the negative electrode 23.

(Method of Manufacturing Light-emitting Device)

Next, an example of a method of manufacturing the light-emitting device 1 having the above-mentioned structure will be described with reference to FIGS. 5 and 6.

Figure 5A:
FIGS. 5A, 5B, 5C, 5D, and 5E are cross-sectional views illustrating an example of a method of manufacturing a light-emitting device.

First, a substrate P shown in FIG. 5A is prepared. Here, the light-emitting element OLED may have a structure (so-called bottom emission) that the light emitted from the light-emitting layer 22 to be described later is extracted from the substrate 11 side and may have a structure (so-called top emission) that the light is extracted from the opposite side of the substrate 11. In the case where the emitted light is extracted from the substrate 11 side, a transparent or semi-transparent material such as glass, quartz, resin, etc. can be used as the substrate material, and inexpensive glass can be used preferably. In the present embodiment, a transparent substrate made of glass, etc. is used as the substrate 11.

A base protecting layer 12 made of a silicon oxide film with a thickness of about 200 to 500 nm is formed on the substrate 11 by a plasma CVD method using TEOS (tetraethoxysilane) or oxygen gas as a raw material as needed.

Thereafter, the silicon layer 13 made of an amorphous silicon film with a thickness of about 30 to 70 nm is formed on the surface of the substrate using the plasma CVD method in a state where the temperature of the substrate 11 is set to about 350° C. Then, by performing a crystallization process to the silicon layer 13 using a laser annealing method or a solid growth method, the silicon layer 13 is crystallized to form a polysilicon film.

Next, the gate insulating layer 14 made of a silicon oxide or nitride film with a thickness of about 60 to 150 nm is formed on the surface of the silicon layer 13 and the substrate 11 by the plasma CVD method using TEOS or oxygen gas as a raw material as needed.

The silicon layer 13 becomes the channel region, the source region, and the drain region of the driving transistor Tr2 shown in FIG. 2, and a semiconductor film which becomes the channel region, the source region, and the drain region of the hold transistor Tr1 at other sectional positions is also formed. That is, since the hold transistor Tr1 and the driving transistor Tr2 are formed at the same time and are formed in the same order, only the hold transistor Tr1 will be described in the following explanation and description of the driving transistor Tr2 will be omitted.

Figure 5B:
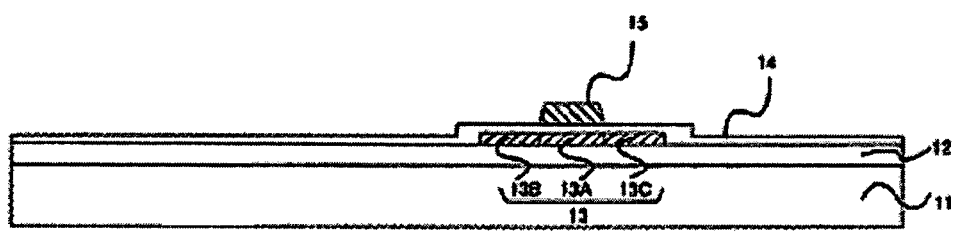

Next, as shown in FIG. 5B, a conductive film made of a metal film such as aluminum, tantalum, molybdenum, titanium, tungsten, etc. or a stacked film thereof is formed using a sputtering method and then is patterned, thereby forming the gate electrode 15. Wires such as the scanning lines 101, etc. are formed at the same time as formation of the gate electrode 15.

Subsequently, by implanting phosphorous ions into the silicon layer 13 with a high concentration, the source and drain regions 13B and 13C are formed in a self-aligned way about the gate electrode 15. At this time, the portion of the silicon layer which is shielded by the gate electrode and into which impurities are not introduced becomes the channel region 13A.

Figure 5C:
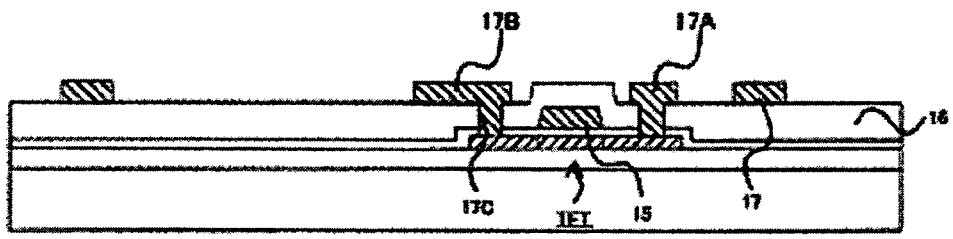

Next, as shown in FIG. 5C, the first interlayer insulating layer 16 covering the surface of the silicon layer 13 and the substrate 11 is then formed. The contact holes 17C penetrating the first interlayer insulating layer 16 are formed and the drain electrode 17A and the source electrode 17B are formed to plug the contact holes 17C, thereby obtaining a thin film transistor TFT. Here, the wires such as the power source line L or the data line 102 are formed on the first interlayer insulating layer 16 to be connected to the source electrode 17B.

Figure 5D:
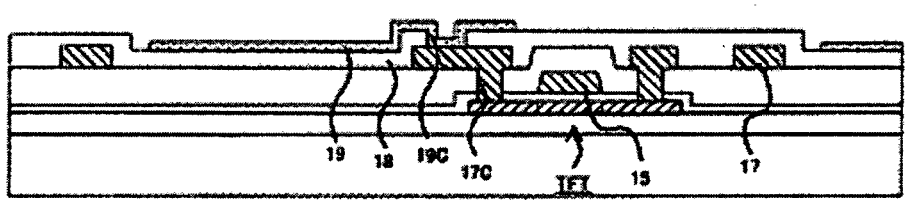

Next, as shown in FIG. 5D, the second interlayer insulating layer 18 is formed to cover the first interlayer insulating layer 16 and the upper surface of the wires, and the contact hole 19C reaching the source electrode 17B through the second interlayer insulating layer 18 are formed. Then, the pixel electrode 19 is formed to plug the contact hole 19C. The pixel electrode 19 is made of a transparent conductive material such as indium tin oxide (ITO), and amorphous indium oxide or zinc oxide.

Figure 5E:
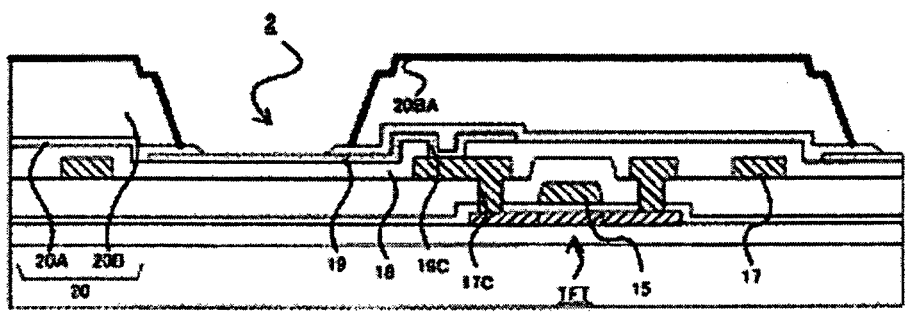

Next, as shown in FIG. 5E, the partition wall 20 is formed to cover a part of the pixel electrode 19 and to surround the pixel forming area 2. The partition wall 20 serves as a partition member for the light-emitting element OLED on the substrate 11. The partition wall 20 comprises the first partition wall portion 20A formed adjacent to the pixel electrode 19 and the second partition wall portion 20B formed on the first partition wall portion 20A.

A silicon oxide film with a thickness of about 50 to 300 nm is formed by the plasma CVD method using TEOS (tetraethoxysilane) or oxygen gas as a raw material, and the first partition wall portion 20A is formed by patterning the silicon oxide film using a photolithography and an etching. The second partition wall portion 20B is made of an organic material such as polyimide resin, acryl resin, etc. Specifically, the second partition wall 20B is formed to avoid the first partition wall 20A formed over the pixel electrode 19. The second partition wall can be formed similarly to the photoresist used in a known photolithography, by mixing a photosensitive material with the organic material. The second partition wall portion 20B has a top wall portion and a side wall portion. The slope of the side wall portion can be set to 30° to 60° by adjusting the curing temperature for curing the organic material. The thickness of the second partition wall portion 20B may be set to, for example, 1 to 2 μm. In this structure, the pixel forming are 2 having a stepped portion with a sufficient height is formed at a position where the hole transporting layer of the light-emitting layer OLED or the light-emitting layer is formed, that is, between the area on the pixel electrode 19 in which the material is coated and the partition wall 20B surrounding the area.

By performing a surface reformation process such as a plasma process using gas containing fluorine, the surface of the second partition wall portion 20B made of an organic material is fluorinated, thereby forming the lyophobic portion 20BA. The first partition wall portion 20A is made of a silicon oxide film and the second partition wall portion 20B is made of an organic material, so that the sensitivities for the surface reformation are different from each other. Therefore, the surface of the second partition wall portion 20B becomes more lyophobic than the pixel electrode 19 or the first partition wall portion 20A. In this way, the lyophobic portion 20BA is formed. When the second partition wall portion 20B is made of a material containing fluoride and is heated to cure the second partition wall portion, fluorides having low surface energy may be allowed to appear on the surface of the second partition wall portion 20B, thereby forming the lyophobic portion 20BA on the surface of the second partition wall portion 20B.

Figure 6F:
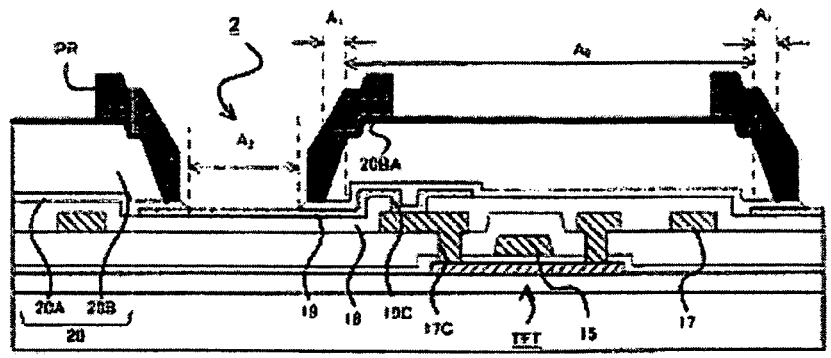
FIGS. 6F, 6G, 6H and 6I are cross-sectional views illustrating an example of the method of manufacturing a light-emitting device.

Next, as shown in FIG. 6F, a known photoresist PR is formed in an area including the area $A_1$ of the second partition wall portion 20B in which the slope is formed. On the other hand, the photoresist PR is not formed on at least a part of an area $A_0$ on the top wall portion of the second partition wall portion 20B and an area $A_2$ corresponding to the pixel forming area 2, so that a part of the lyophobic portion 20BA in the area $A_0$ and the pixel electrode 19 in the pixel forming area 2 are exposed.

Figure 6G:
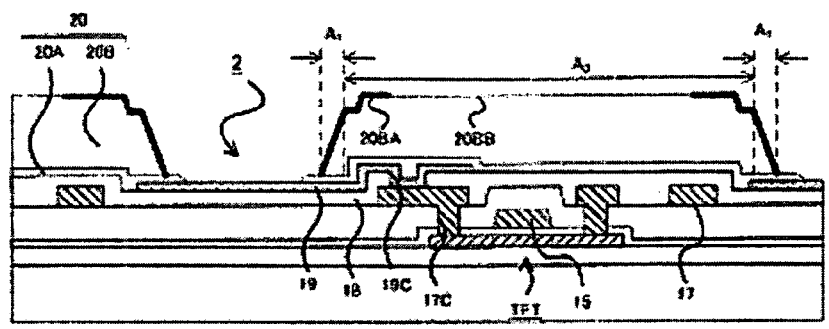

Then, an oxidation process such as oxygen plasma oxidation, UV ozone oxidation, etc. is performed through the photoresist PR, using the photoresist PR as a mask. As a result, the lyophobic portion 20BA attached to a part of the top wall portion of the second partition wall portion 20B is removed. The surface of the organic material constituting the second partition wall portion 20B may be oxidized. In this way, the adhesion portion 20BB is formed on the top wall portion of the second partition wall portion 20B through the photoresist PR. Thereafter, by removing the photoresist PR, the structure shown in FIG. 6G is obtained. The step of forming the contact portion 20BB may be a step of nitrification. By performing the oxidation process or the nitrification process, it is possible to increase the surface energy of the partition wall.

By making the second partition wall portion 20B out of an organic material and performing the oxidation process such as oxygen plasma oxidation, UV ozone oxidation, etc. to the top wall portion of the second partition wall portion 20B, a part of the second partition wall portion 20B is ashed, and thus at least a part of the top wall portion of the second partition wall portion 20B is roughened. On the contrary, the second partition wall portion 20B and the lyophobic portion 20BA covered with the photoresist PR are not roughened.

At this time, the surface of the pixel electrode 19 in the pixel forming area 2 is cleaned and activated by performing the oxidation process such as oxygen plasma oxidation, UV ozone oxidation, etc. through the photoresist PR using the photoresist PR as a mask. In indium tin oxide (ITO) or amorphous indium oxide or zinc oxide constituting the pixel electrode 19, the quantity of oxygen is decreased and thus the work function thereof may be decreased. By performing the oxidation process such as oxygen plasma oxidation, UV ozone oxidation, etc. to the surface of the pixel electrode 19, indium tin oxide (ITO) or amorphous indium oxide or zinc oxide is oxidized and the work function is increased, thereby improving the ability of injecting holes as positive poles into the light-emitting layer 22. In addition, the lyophilic property of the pixel electrode 19 is improved by the oxidation process, and the organic substances attached to the pixel electrode 19 or the residuals in patterning the second partition wall portion 20B can be removed.

In this way, since the surface of the pixel electrode 19 in the pixel forming area 2 is cleaned and activated at the same time as forming the adhesion portion 20BB, it is not necessary to separately perform the step of forming the adhesion portion 20BB and the step of cleaning and activating the surface of the pixel electrode 19 in the pixel forming area 2, so that it is possible to form the adhesion portion 20BB without increasing the number of manufacturing steps.

Figure 6H:
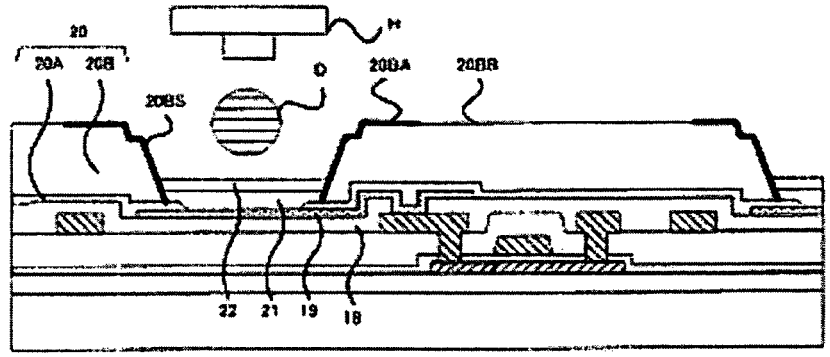

Next, as shown in FIG. 6H, the hole transporting layer 21 and the light-emitting layer 22 are formed in each pixel forming area 2 on the pixel electrodes using a liquid droplet ejecting method (the inkjet method). The manufacturing method using the liquid droplet ejecting method means a method of coating each pixel forming area 2 with the liquid-state material D by ejecting the liquid-state material, in which an organic compound material constituting the hole transporting layer 21 and the light-emitting layer 22 is dissolved in a predetermined solvent or dispersed in a predetermined dispersion medium, from an inkjet head H. By using a head employing a piezoelectric element as the inkjet head H, the organic compound material including π-electron conjugated conductive polymers can be coated without deterioration. Since the lyophilic property is predominant on the pixel electrode 19 and the peripheries thereof in each pixel forming area 2, the liquid-state material D arranged on the pixel electrode 19 is diffused on the whole surface of the pixel electrode 19. On the other hand, since the lyophobic portion 20BA is formed to surround the pixel forming area 2, the liquid-state material D in each pixel forming area 2 is arranged in a predetermined pixel forming area 2 without flowing in an adjacent pixel forming area 2 over the partition wall 20.

The hole transporting layer 21 can be formed by ejecting the liquid-state material D, in which the hole transporting layer material is dissolved in a solvent or dispersed in a dispersion medium, to each pixel forming area 2 on the pixel electrodes 19 from an inkjet head H, arranging the liquid-state material on the pixel electrode 19, and removing the solvent or dispersion medium. As a result, the hole transporting layer 21 made of the hole transporting layer material is fixed onto each pixel electrode 19. For example, polythiophene derivatives, polypyrrole derivatives, etc. or doped materials thereof can be used as the hole transporting layer material. Specifically, a dispersed liquid of 3,4-polyethylenedioxythiophene/polystyrenesulfonic acid (PEDOT/PSS) can be used.

Next, the light-emitting layer can be formed by ejecting the liquid-state material D, in which the light-emitting layer material is dissolved in a solvent or dispersed in a dispersion medium, to each pixel forming area 2 from an inkjet head H using the inkjet method, arranging the liquid-state material on the hole transporting layer 21, and removing the solvent or dispersion medium. As a result, the light-emitting layer 22 made of the light-emitting layer material is fixed onto the hole transporting layer 21. The light-emitting layer 22 may be formed in the entire pixel forming areas 2 using the same light-emitting layer material, and plural kinds of light-emitting layers 22 may be formed in the respective pixel forming areas 2 using plural light-emitting layer materials such as a red light-emitting material, a blue light-emitting layer material, a green light-emitting layer material, etc.

Known organic light-emitting materials capable of emitting fluorescence or phosphorescence can be used as the light-emitting layer material. Specifically, (poly) fluorene derivatives (PF), (poly) paraphenylene vinylene derivatives (PPV), polyphenylene derivatives (PP), polyparaphenylene derivatives (PPP), polyvinylcarbazole (PVK), polythiophene derivatives, polydialkylfluorene (PDAF), polyfluorenebenzothiadiazole (PFBT), polyalkylthiophene (PAT), and polysilane group such as polymethylphenylsilane (PMPS) can be suitably used. These high polymer materials may be doped with lower polymer materials such as perylene dye, coumarin dye, rhodamine dye, etc., or lower polymer materials such as rubrene, perylene, 9,10-diphenylanthracene, tetraphenylbutadiene, Nile red, coumarin 6, quinacridone, etc. for use.

Figure 6I:
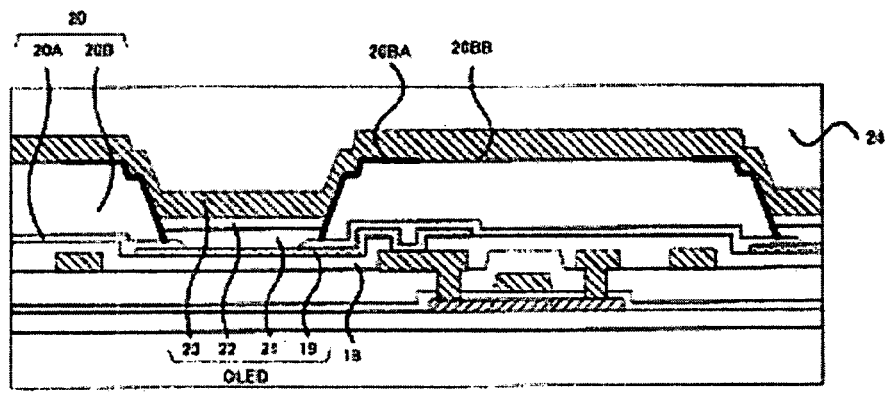

Subsequently, as shown in FIG. 6I, an LiF layer having a thickness of 2 nm, a Ca layer having a thickness of 20 nm, and an Al layer having a thickness of 200 nm are stacked as the negative electrode 23 on the whole surface of the partition wall 20 and the light-emitting layer 22, for example, using a vacuum heating deposition method. At this time, the negative electrode is formed to directly come in contact with the adhesion portion 20BB formed on the second partition wall portion 20B. As a result, the negative electrode 23 and the partition wall 20 can be strongly bonded to each other. Accordingly, the light-emitting element OLED comprising the pixel electrode 19, the hole transporting layer 21, the light-emitting layer 22, and the negative electrode 23 can be formed. The light-emitting element OLED may include a hole transporting layer, a hole blocking layer, an electron transporting layer, an electron injecting layer, an electron blocking layer. By allowing the material constituting the negative electrode 23 to include oxygen atoms or nitrogen atoms and oxidizing or nitrifying the adhesion portion 20BB, the bonding power between the partition wall 20 and the negative electrode 23 can be further improved.

The sealing layer 24 is formed to cover the whole surface of the negative electrode 23 on the light-emitting element OLED. It is preferable that the sealing layer 24 has a first sealing layer made of organic resin and a second sealing layer which is made of an inorganic material such as silicon oxide or silicon oxynitride and which is formed to have a gas barrier property and to cover the first sealing layer. The first sealing layer can be formed by applying the liquid material including derivatives or oligomers or monomers of acryl resin, polyimide resin, etc. using a screen print method or a slit coating method and then curing the liquid material. It is preferable that the first sealing layer has a thickness of about 1 to 2 μm, which is equal to the thickness of the second partition wall portion 20B.

By using an ion plating method or a sputtering method employing high-density plasma such as ICP plasma and ECR plasma, the second sealing layer is formed which is made of an inorganic material such as silicon oxide or silicon oxynitride and has a gas barrier property.

By forming the first sealing layer, it is possible to planarize the step difference formed due to the partition wall 20, the contact hole 17C, the contact hole 19C, the hold transistor Tr1, the driving transistor Tr2, the storage capacitor CAP, the scanning line 101, the data line 102, and the power source line L. Accordingly, since the stress applied to the second sealing layer can be reduced, it is possible to form the second sealing layer having a high gas barrier property with a high density.

Here, since the partition wall 20 including the adhesion portion 20BB and the first sealing layer are all made of organic resin, the stress between the negative electrode 23 and the partition wall 20 can be reduced. Specifically, it is preferable that the partition wall 20 and the first sealing layer are made of materials having the same stress. It is also preferable that the first partition wall portion 20A and the second sealing layer are all made of silicon oxide as a major component.

In this way, the adhesion portion 20BB formed on the second partition wall portion 20B directly comes in contact with the negative electrode 23. The negative electrode 23 has a weak bonding power to the lyophobic portion 20BA due to the high surface energy of the lyophobic portion, but the adhesion portion 20BB and the negative electrode 23 are strongly bonded to each other. That is, since the second partition wall portion 20B on which the lyophobic portion 20BA is not formed serves as a adhesion portion for bonding the partition wall 20 and the negative electrode 14 to each other, it is possible to embody a light-emitting device in which the partition wall 20 and the second electrode 23 are not peeled off from each other, thereby providing great resistance to deterioration or change in environment and high reliability.

It is preferable that the adhesion portion 20BB is formed by roughening the top wall portion of the second partition wall portion 20B. Since the surface area in which the second partition wall portion 20B and the negative electrode 23 come in contact with each other can be enhanced by the roughening, it is possible to improve the bonding power between the partition wall 20 and the negative electrode 23.

Since the second partition wall portion 20B or the lyophobic portion 20BA covered with the photoresist PR, that is, the second partition wall portion 20B positioned in the slope area $A_1$ as a peripheral area of the pixel electrode 19 or the side wall portion of the lyophobic portion 20BA is not roughened, a dynamic contact angle of the liquid-state material D is not deteriorated and thus the liquid-state material D reaches the pixel forming area 2 without being attached to the slope area, thereby contributing to forming the organic compound layer (the hole transporting layer 21 or the light-emitting layer 22). As a result, the liquid-state material D can be effectively used.

Figure 7:
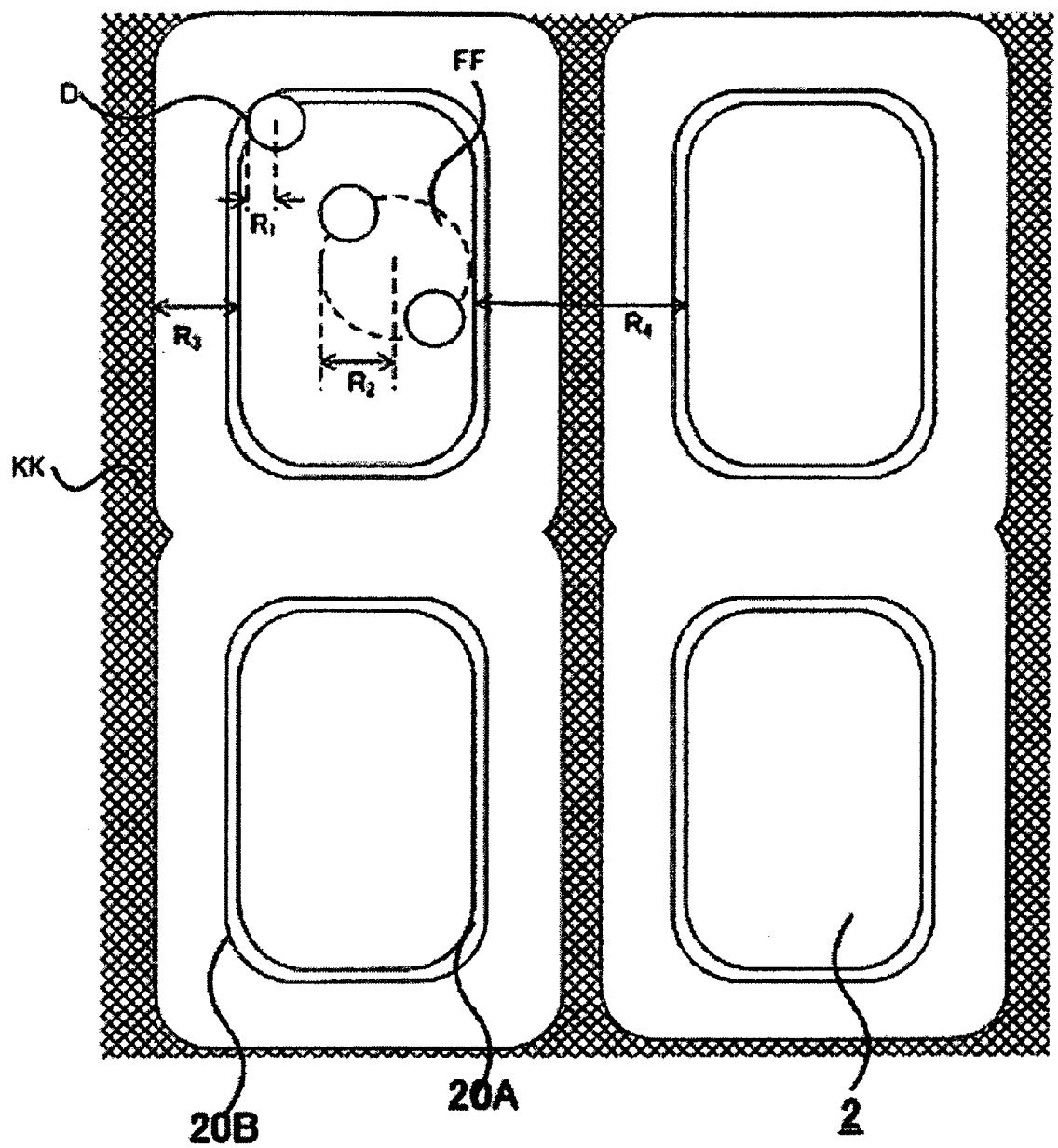
FIG. 7 is a plan view illustrating a pixel forming area.

FIG. 7 is a plan view illustrating the pixel forming areas 2. In the figure, the radius $R_1$ of the liquid-state material D, the radius $R_2$ of an arrangement deviation when the liquid-state material is ejected from the inkjet head and is arranged on the substrate 11, the distance $R_3$ between one pixel forming area 2 and the adhesion portion 20BB, and the gap $R_4$ between one pixel forming area and an adjacent pixel forming area are all shown. It is preferable that the adhesion portion 20BB is formed in at least a part of the area $A_0$ on the top wall portion of the second partition wall portion 20B, that is, in an area satisfying the following expression (Expression 1).

$$R_4 \geq R_3 \geq (R_1+R_2) \quad \text{(Expression 1)}$$

As a result, since the portion where the liquid-state material D is arranged can be set to the lyophobic portion 20BA, not the adhesion portion 20BB, it is possible to arrange the liquid-state material D inside a predetermined pixel forming area 2 without flowing in other pixel forming areas 2 adjacent thereto over the partition wall 20. It is preferable that the adhesion portion 20BB is formed in the hatched area KK.

Second Embodiment

Next, a second embodiment of the present invention will be described. The light-emitting device according to the second embodiment is substantially equal to the light-emitting device according to the first embodiment, except for the shape of the adhesion portion and the manufacturing method thereof. Therefore, the same constituent elements are denoted by the same reference numerals and the detailed description thereof is omitted.

Figure 8:
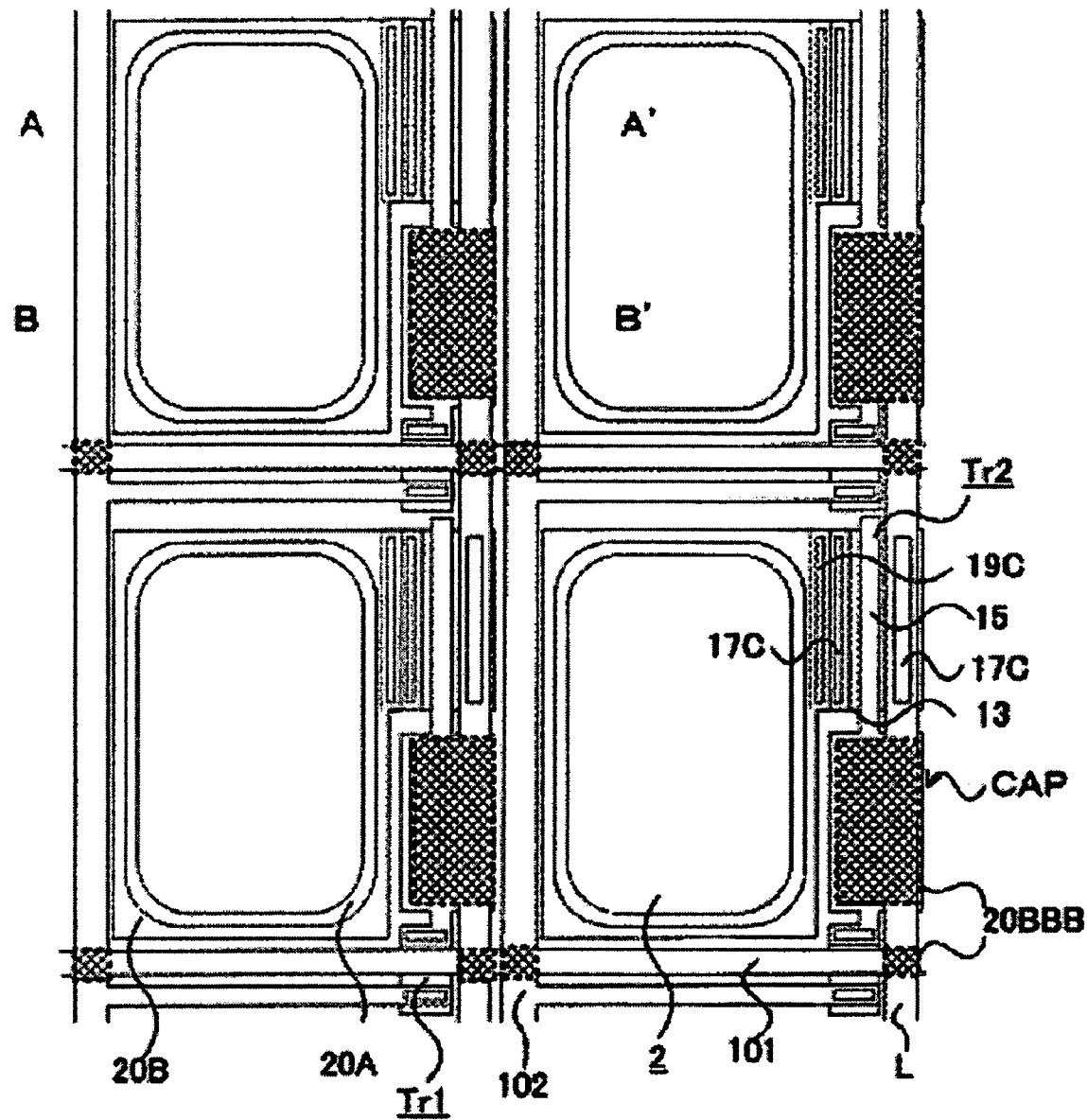
FIG. 8 is a plan view illustrating a light-emitting device according to a second embodiment of the present invention.
Figure 9:
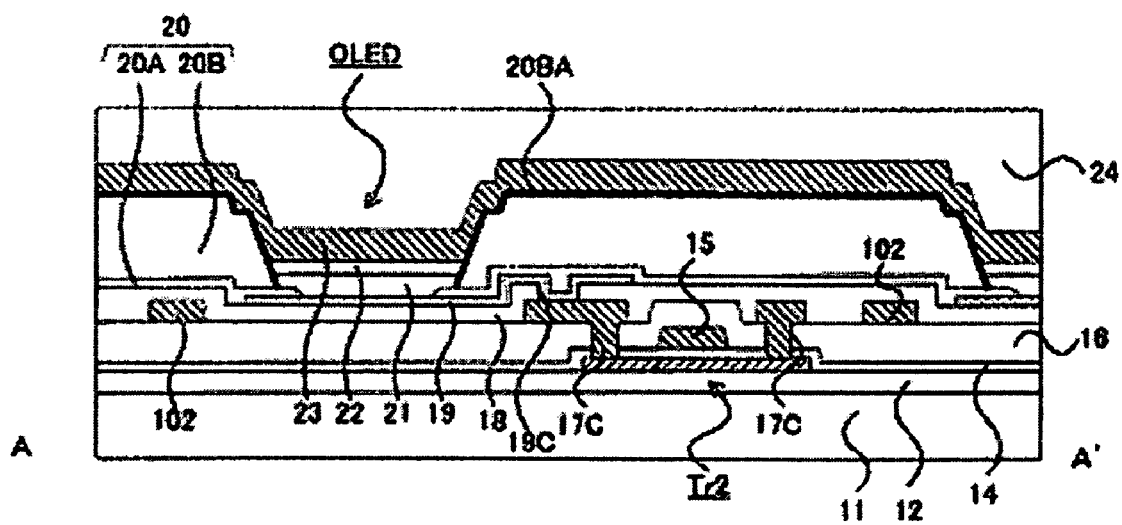
FIG. 9 is a cross-sectional view taken along Line A-A' shown in FIG. 8.
Figure 10:
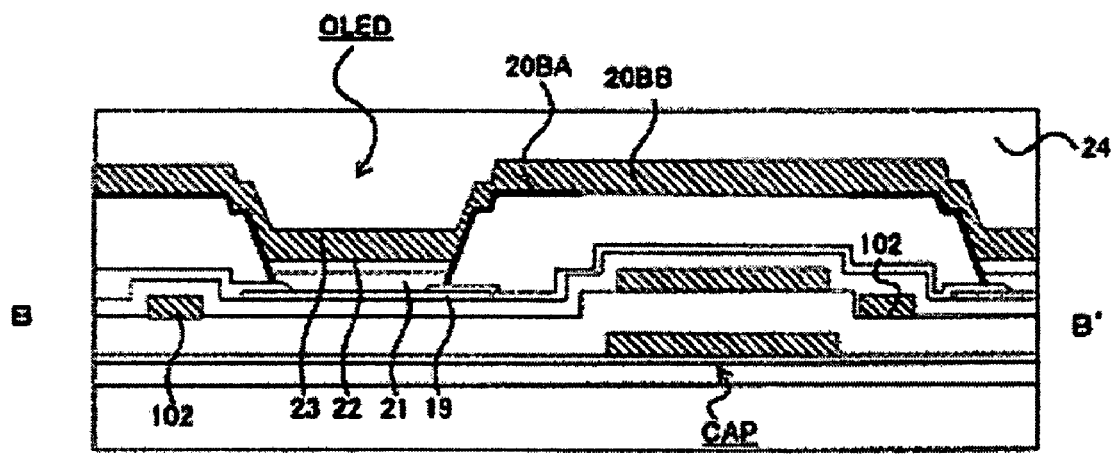
FIG. 10 is a cross-sectional view taken along Line B-B' shown in FIG. 8.

FIG. 8 is a plan view illustrating the light-emitting device according to the second embodiment, FIG. 9 is a cross-sectional view taken along Line A-A' shown in FIG. 8, and FIG. 10 is a cross-sectional view taken along Line B-B' shown in FIG. 8.

As shown in FIG. 8, the adhesion portions 20BB of the second partition wall portion 20B indicated by the hatched portion are provided to correspond to the storage capacitors CAP, the intersections between scanning lines 101 and the data lines 102 or the intersections between the scanning lines 101 and the power source lines L. That is, the adhesion portion 20BB is formed on the surface of the second partition wall portion 20B in the intersection between the gate electrode 15 or the metal portion (for example, the scanning line 101, one electrode of the storage capacitor CAP) forming the same layer as the gate electrode 15, and the source electrode 17A and the drain electrode 17B or the metal portion (for example, the data line 102, the power source line L, or the other electrode of the storage capacitor CAP) forming the same layer as the source electrode 17A or the drain electrode 17B. The adhesion portion 20BB is formed in an area where plural metal layers are two-dimensionally superposed.

Next, an example of the manufacturing method of the light-emitting device 1 having the above-mentioned structure will be described with reference to FIG. 11. As a manufacturing step corresponding to the cross-sectional view taken along Line B-B' shown in FIG. 8, since FIG. 11E of the second embodiment corresponds to FIG. 5E of the first embodiment and is common to the first embodiment, the description thereof is omitted. A stepped portion D2 is formed on the surface of the second partition wall portion 20B to correspond to the stepped portion D1 on the end surface of the storage capacitor CAP, and the area $A_3$ having a height greater than the peripheries thereof by the thickness of the gate electrode 15 or the source electrode 17 is formed on the surface of the second partition wall portion 20B.

By performing a surface reformation process such as a plasma process using gas containing fluorine, the surface of the second partition wall portion 20B made of an organic material is fluorinated, thereby forming the lyophobic portion 20BA. The first partition wall portion 20A is made of a silicon oxide film and the second partition wall portion 20B is made of an organic material, so that the sensitivities for the surface reformation are different from each other. Therefore, the surface of the second partition wall portion 20B becomes more lyophobic than the pixel electrode 19 or the first partition wall portion 20A. In this way, the lyophobic portion 20BA is formed. When the second partition wall portion 20B is made of a material containing fluoride and is heated to cure the second partition wall portion, fluorides having low surface energy may be allowed to appear on the surface of the second partition wall portion 20B, thereby forming the lyophobic portion 20BA on the surface of the second partition wall portion 20B.

Figure 11E:
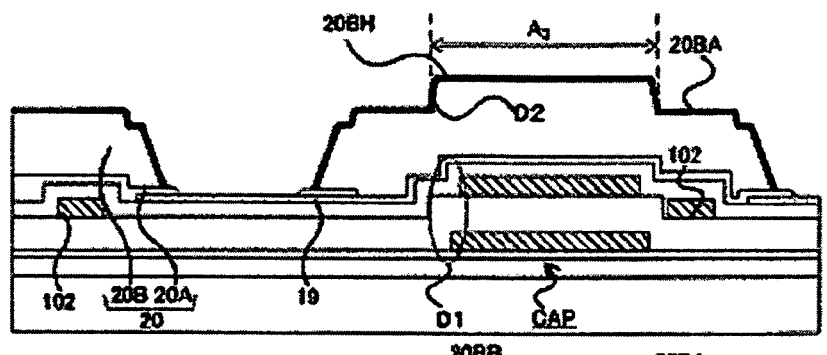
FIGS. 11E, 11G, 11H, and 11I are cross-sectional views illustrating a method of manufacturing an organic EL device according to the second embodiment.
Figure 11G:
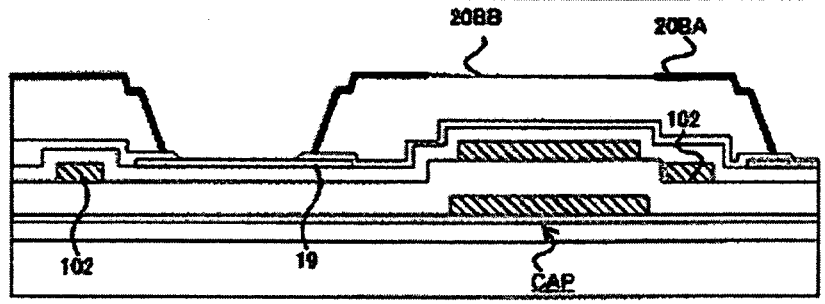

By gradually performing a grinding process or a polishing process to the lyophobic portion 20BA formed on the second partition wall portion 20B, as shown in FIG. 11G, the lyophobic portion 20BA on the stepped portion D is removed, so that the second partition wall portion 20B which is previously formed not to be lyophobic is exposed. The second partition wall portion 20B not lyophobic serves as the adhesion portion 20BB. The adhesion portion 20BB is similarly formed in the intersection between the scanning line 101 and the data line 102, or in the intersection between the scanning line 101 and the power source line L.

Figure 11H:
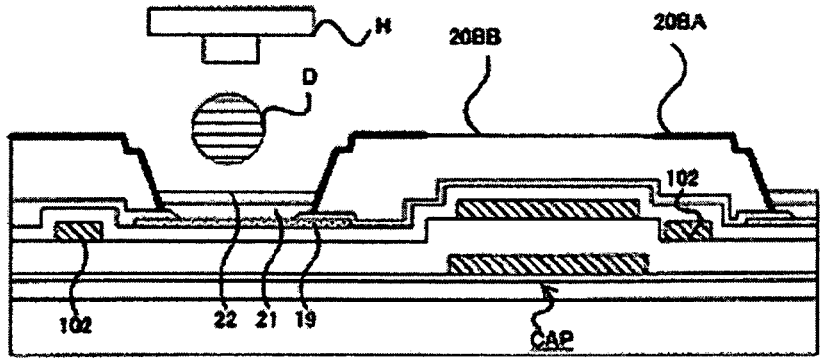
Figure 11I:
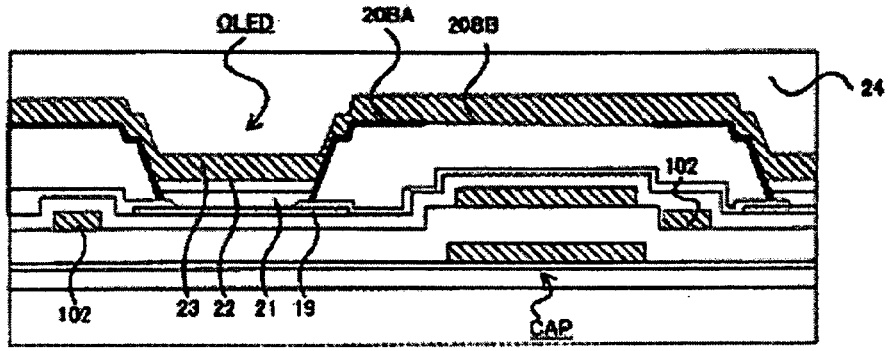

Subsequently, as shown in FIG. 11H, the hole transporting layer 21 and the light-emitting layer 22 are formed using the inkjet method, similarly to the first embodiment. Thereafter, as shown in FIG. 11I, the negative electrode 23 and the sealing layer 24 are sequentially stacked and formed on the whole surface of the second partition wall portion 20B and the light-emitting layer 22, in a state where the lyophobic portion 20BA on the stepped portion D is removed and thus the adhesion portion 20BB is formed.

At this time, the negative electrode 23 is formed to directly come in contact with the adhesion portion 20BB formed on the second partition wall portion 20B. Since the lyophobic portion is not formed on the adhesion portion 20BB, the adhesion portion 20BB and the negative electrode 23 are strongly bonded to the second partition wall portion 20B. Since the lyophobic portion 20BA has low surface energy, the negative electrode 23 has a weak bonding power to the lyophobic portion 20BA. However, since the adhesion portion 20BB and the negative electrode 23 do not have the lyophobic portion, the adhesion portion and the negative electrode are strongly bonded to each other. That is, since the second partition wall portion 20B in which the lyophobic portion 20BA is not formed serves as a adhesion portion bonding the partition wall 20 and the negative electrode 14 to each other, it is possible to embody a light-emitting device in which the partition wall 20 and the second electrode 23 are not peeled off from each other, thereby providing great resistance to deterioration or change in environment and high reliability.

It is possible to form the adhesion portion 20BB without using the photoresist PR and to strongly bond the partition wall 20 and the negative electrode 14 to each other.

Third Embodiment

Next, a third embodiment of the present invention will be described with reference to FIG. 12. The light-emitting device according to the third embodiment is substantially equal to the light-emitting device according to the aforementioned embodiments, except for the shape of the adhesion portion and the manufacturing method thereof. Therefore, the same constituent elements are denoted by the same reference numerals and the description thereof is omitted.

FIG. 12 is cross-sectional views illustrating a method of manufacturing an organic EL device according to the third embodiment.

Figure 12E:
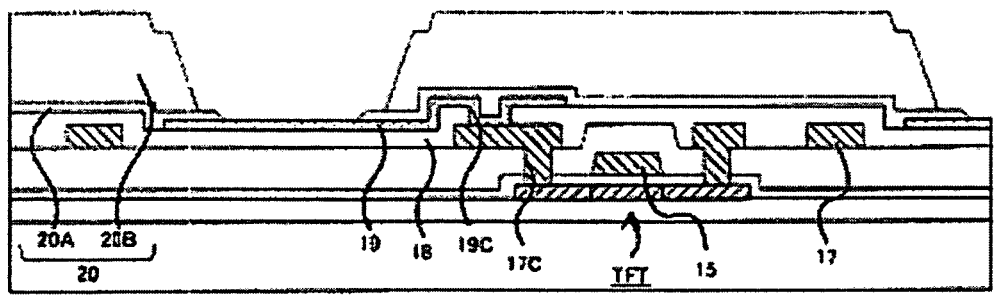
FIGS. 12E, 12F, and 12G are cross-sectional views illustrating a method of manufacturing an organic EL device according to a third embodiment.
Figure 12F:
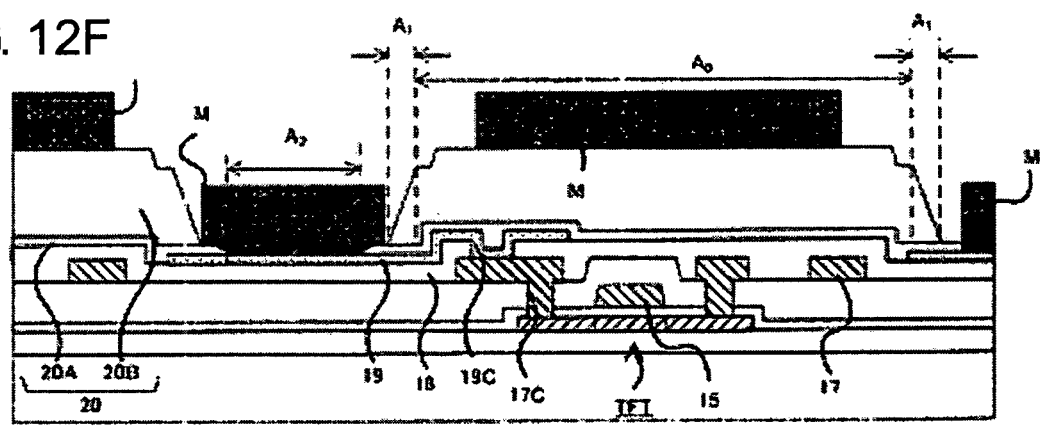

First, as shown in FIG. 12E, the second partition wall portion 20B is formed on the first partition wall portion 20A. Next, as shown in FIG. 12F, a known photoresist M is formed in at least a part of the top area $A_0$ of the top wall portion on the second partition wall portion 20B and in the pixel forming area 2 indicated by an area $A_2$, other than the area $A_1$ of the second partition wall portion 20B in which the slope is formed. Therefore, parts of the side wall portion and the top wall portion of the second partition wall portion 20B are exposed.

Figure 12G:
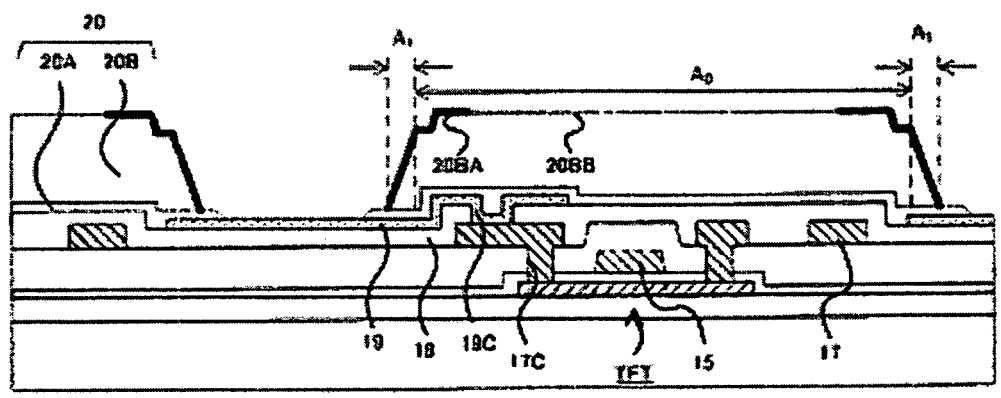

Next, by performing a surface reformation process such as plasma process using gas containing fluorine and using the photoresist M as a mask, the surfaces of the second partition wall portion 20B made of an organic material and the photoresist M are fluoridated, thereby forming the lyophobic portion 20BA. The photoresist M is removed along with the lyophobic portion 20BA formed on the surface of the photoresist M. As a result, as shown in FIG. 12G, the lyophobic portions 20BA are formed on parts of the side wall portion and the top wall portion of the second partition wall portion 20B. On the other hand, the lyophobic portion 20BA is not formed on the top wall portion of the second partition wall portion 20B on which the photoresist M is formed, and on the pixel forming area. The top wall portion of the second partition wall portion 20B on which the lyophobic portion 20BA is not formed severs as the adhesion portion 20BB.

Subsequently, the hole transporting layer 21 and the light-emitting layer 22 are formed using the inkjet method, similarly to the aforementioned embodiments. Thereafter, the negative electrode 23 and the sealing layer 24 are sequentially stacked and formed on the whole surface of the second partition wall portion 20B and the light-emitting layer 22.

At this time, the negative electrode 23 is formed to directly come in contact with the adhesion portion 20BB formed on the surface of the second partition wall portion 20B. Since the lyophobic portion is not formed on the adhesion portion 20BB, the negative electrode 23 is strongly bonded to the adhesion portion 20BB and the partition wall 20 and the negative electrode 23 are strongly bonded to each other. Accordingly, it is possible to embody a light-emitting device in which the partition wall 20 and the second electrode 23 are not peeled off from each other, thereby providing strong resistance to deterioration or change in environment and high reliability.

Fourth Embodiment

Next, an application of the organic EL device 1 described in the embodiments to an electronic apparatus will be described with reference to FIG. 13.

Figure 13:
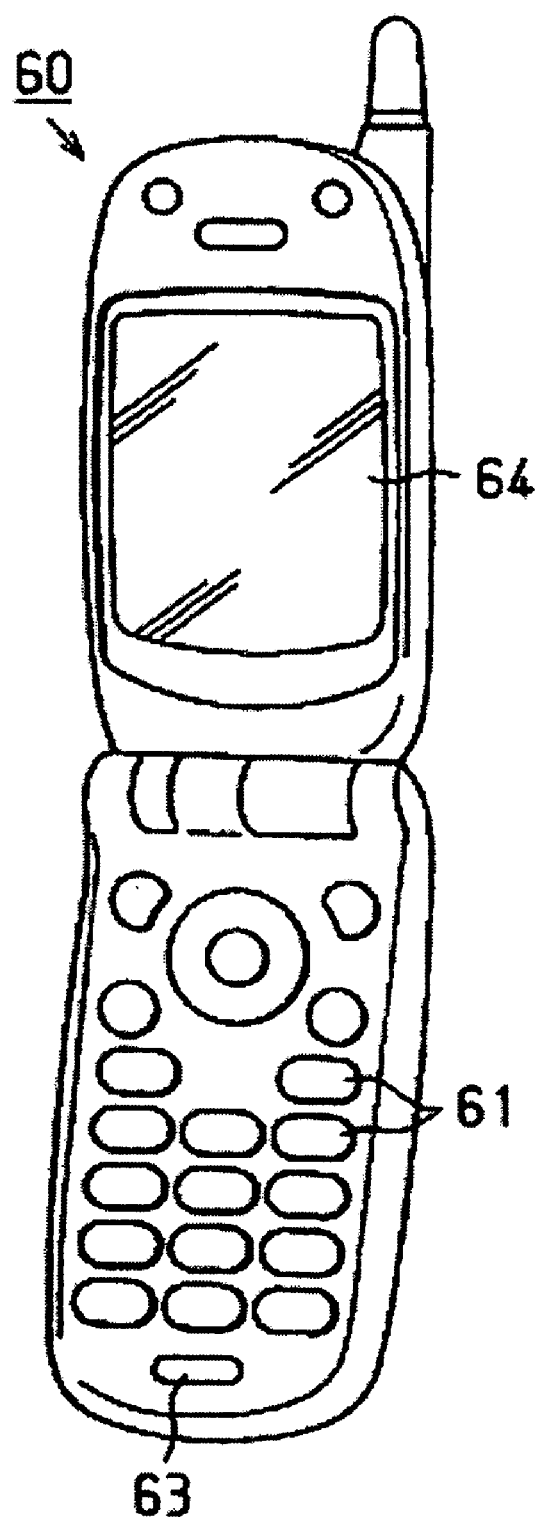
FIG. 13 is a perspective view of a mobile phone illustrating an example where the present invention is applied to a display unit of the mobile phone as an example of an electronic apparatus.

FIG. 13 is a perspective view of a mobile phone illustrating an example where the present invention is applied to a display unit of a mobile phone as an example of the electronic apparatus. In FIG. 13, the mobile phone 60 comprises a display unit 64 employing a light-emitting device 1, and a plurality of manipulation buttons 61. In addition to the mobile phone, examples of the electronic apparatus can include a personal computer, a personal digital assistant, a digital camera, a television monitor, a view-finder type or monitor-direct-vision type video tape recorder, a car navigation apparatus, a pager, an electronic pocket book, a calculator, a word processor, a work station, a television phone, a POS terminal, an apparatus having a touch panel, and the like. The light-emitting device according to the present invention may be used as a display unit of such a variety of electronic apparatuses. The light-emitting device according to the present invention may be applied to an exposing head of an image forming apparatus. The electronic apparatuses employing the light-emitting device 1 hardly cause light emission failure.

The liquid material described in the claims of the present invention corresponds to the liquid-state material D in the embodiments described above. The mask described in the claims corresponds to the photoresist PR or the photoresist M in the embodiments described above. The driving circuit described in the claims corresponds to the contact hole 17C, the contact hole 19C, the hold transistor Tr1, the driving transistor Tr2, the storage capacitor CAP, the scanning lines 101, the data lines 102, and the power source lines L. The light-emitting device described in the claims corresponds to the light-emitting device 1 in the embodiments described above. The first electrode described in the claims corresponds to the pixel electrodes 19 in the embodiments described above. The organic compound layer described in the claims corresponds to the hole transporting layer 21 or the light-emitting layer 22. The organic compound layer or the light-emitting layer described in the claims corresponds to the light-emitting layer 22 in the embodiments described above. The second electrode described in the claims corresponds to the negative electrode 23 in the embodiments described above.

The present invention is not limited to the above-mentioned embodiments but may be put into practice as follows.

The organic compound layer has been formed using the inkjet method in the embodiments described above, but the present invention is not limited to the inkjet method. The organic compound layer may be formed using, for example, an inkjet method, a slit coating method, a dispensing method, a screen print method, etc., and any method may be used only if it is a liquid phase method.

In the embodiments described above, the pixel circuit shown in FIG. 2 has been described, but the present invention is not limited to the pixel circuit.

In the embodiments described above, the light-emitting device employing the organic electroluminescence element has been exemplified, but the present invention may be applied to other light-emitting devices. The present invention can be applied to a variety of light-emitting devices such as a field emission display (FED), a surface-conduction electron-emitter display (SED), a ballistic electron surface emitting display (BSD), a display device using a light-emitting diode, a writing head of an optical recording printer or an electronic copier, etc., similarly to the embodiments described above.

What is claimed is:

1. A method of manufacturing a light-emitting device, the method comprising the steps of:
    forming a first electrode on a substrate;
    forming a partition wall having a top wall portion and a side wall portion to overlap at least a part of the first electrode;
    forming an adhesion portion on at least a part of the top wall portion of the partition wall;
    arranging a liquid material including an organic compound in pixel forming areas partitioned by the partition wall; and
    forming a second electrode on the adhesion portion so as to cover the partition wall and the pixel forming,
    the forming the top wall portion such that at least a part of the top wall portion has a rougher face than that of the side wall portion and the top wall portion being in contact with the second electrode.

2. The method of manufacturing a light-emitting device according to claim 1,
    wherein the step of forming the partition wall is a step of forming at least a part of the top wall portion of the partition wall out of an organic material, and
    wherein the step of forming the adhesion portion is a step of forming the adhesion portion out of the organic material constituting the partition wall.

3. The method of manufacturing a light-emitting device according to claim 1,
    wherein the step of forming the partition wall includes a step of forming a lyophobic portion on the partition wall, and
    wherein the step of forming the adhesion portion is a step of removing a part of the lyophobic portion.

4. The method of manufacturing a light-emitting device according to claim 3, the method further comprising a step of forming a driving circuit and forming a first stepped portion,
    wherein the step of forming the partition wall is a step of forming a second stepped portion corresponding to the first stepped portion on the top wall portion of the partition wall, and
    wherein the step of forming the adhesion portion is a step of cutting out a part of the partition wall correspondingly to the second stepped portion.

5. The method of manufacturing a light-emitting device according to claim 1,
    wherein the step of forming the adhesion portion is a step of roughening the top wall portion of the partition wall.

6. The method of manufacturing a light-emitting device according to claim 5,
    wherein the step of forming the adhesion portion includes the steps of:
    covering a portion of the partition wall corresponding to the peripheral border of the first electrode with a mask; and
    forming the adhesion portion using the mask.

7. The method of manufacturing a light-emitting device according to claim 1,
    wherein the step of forming the adhesion portion is a step of oxidizing or nitrifying the top wall portion of the partition wall.

8. The method of manufacturing a light-emitting device according to claim 1, the method further comprising a step of cleaning or activating the first electrode,
    wherein the step of forming the adhesion portion is performed at the same time as the step of cleaning or activating the first electrode.

9. A light-emitting device, comprising:
    a substrate;
    a partition wall, the partition wall partitioning a plurality of pixel forming areas on the substrate;
    a first electrode, the first electrode being formed in each of the pixel forming area;
    a second electrode formed to cover the partition wall and the pixel forming area; and
    an organic compound layer having at least a light-emitting layer between the first electrode and the second electrode,
    the partition wall has a top wall portion and a side wall portion,
    at least a part of the top wall portion having a rougher face than that of the side wall portion, and
    the top wall portion being in contact with the second electrode.

10. The light-emitting device according to claim 9, further comprising a driving circuit being provided correspondingly to the respective pixel forming areas,
    the roughing face formed above the driving circuit.

11. The light-emitting device according to claim 9, further comprising a sealing layer having a first sealing layer and a second sealing layer and covering the second electrode, the first sealing layer being made of organic resin and the second sealing layer being made of silicon oxide or silicon oxynitride.

12. An electronic apparatus comprising the light-emitting device according to claim 9.

* * * * *